United States Patent
Rokman et al.

(10) Patent No.: US 6,258,203 B1
(45) Date of Patent: Jul. 10, 2001

(54) BASE WEBS FOR PRINTED CIRCUIT BOARD PRODUCTION USING THE FOAM PROCESS AND ACRYLIC FIBERS

(75) Inventors: Kay Rokman, Karhula (FI); Rod Komlenic; Kelly Rennels, both of Mt. Holly Springs, PA (US); Hakan Sabel, Karhula (FI)

(73) Assignee: Ahlstrom Glassfibre Oy (FI)

(*) Notice: Subject to any disclaimer, the term of this patent is extended or adjusted under 35 U.S.C. 154(b) by 0 days.

(21) Appl. No.: 09/399,775

(22) Filed: Sep. 21, 1999

(51) Int. Cl.[7] ....................................... D04H 5/00
(52) U.S. Cl. .................. 156/296; 162/101; 442/60; 442/334; 442/356
(58) Field of Search .................. 442/60, 327, 334, 442/335, 336, 352, 356, 357; 29/830; 156/296; 162/101, 157.1

(56) References Cited

U.S. PATENT DOCUMENTS

| | | |
|---|---|---|
| 4,282,283 | 8/1981 | George et al. . |
| 4,550,051 | 10/1985 | Spielau et al. . |
| 4,698,267 | 10/1987 | Tokarsky . |
| 4,729,921 | 3/1988 | Tokarsky . |
| 4,743,495 | 5/1988 | Lilani et al. . |
| 4,883,708 | 11/1989 | Kariya et al. . |
| 4,997,702 | 3/1991 | Gazit et al. . |
| 5,692,940 | 12/1997 | Kinbara et al. . |
| 5,997,492 | * 12/1999 | Delmore et al. . |
| 6,045,897 | 4/2000 | Sakai et al. ........................... 428/219 |

FOREIGN PATENT DOCUMENTS 2311304   9/1997  (GB) .

* cited by examiner

Primary Examiner—Michael W. Ball
Assistant Examiner—John T. Haran
(74) Attorney, Agent, or Firm—Nixon & Vanderhye P.C.

(57) ABSTRACT

A printed circuit board is made from at least one non-woven sheet or web layer comprising at least 50% by weight acrylic fibers, with any balance substantially electrically non-conductive fibers, filler, and binder. The sheet or web is preferably made by the foam process, and may contain 60–80% straight polyacrylonitrile fibers and 40–20% fibrillated (pulp) ones. The web or sheet is preferably compressed by thermal calendering so that it has a density of about 0.1–1 grams per cubic centimeter; and the web or sheet may have a basis weight of between about 20–120 grams per square meter. The web or sheet may also have a 1–40% of substantially electrically non-conductive organic or inorganic binder, or may be substantially binder free. A printed circuit board made using the layers of these non-woven webs or sheets is otherwise conventional, including a pre-preg material, electrically conductive circuit elements, and electronics, and has improved properties compared to woven glass and non-woven aramid products, including improved fiber consolidation, easy board construction, and improved MD/CD ratio and stability.

24 Claims, 2 Drawing Sheets

BASE WEBS FOR PRINTED CIRCUIT BOARD PRODUCTION USING THE FOAM PROCESS AND ACRYLIC FIBERS

BACKGROUND AND SUMMARY OF THE INVENTION

Printed circuit boards (also called printed wire boards or PWBs) are conventionally made of primarily fiberglass fibers, with electrically non-conductive fillers. However there has been increasing interest in making printed circuit boards from aramid fibers since aramid fibers have a number of advantages over glass, or mixtures of aramid and glass fibers are used. For example, duPont Chemical Company uses its own brand of aramid fiber ("THERMOUNT") in the production of printed circuit boards.

The duPont aramid PCBs are made using the conventional liquid laid process for non-woven web production using a foraminous element, such as a wire. In order to effectively make non-woven webs using aramid fibers by the liquid laid process, duPont uses a blend of different length and diameter aramid fibers, some of which may be fibrillated, in an attempt to produce versatile and entirely commercially acceptable printed circuit boards. However there are numerous problems associated with the water laid process of production of aramid non-woven sheets or webs using conventional para aramid fibers (which are "straight").

Conventional aramid printed circuit boards, and layers formed of non-woven webs making up such boards, have a significant number of problems including the inability to randomly disperse the aramid fibers as uniformly as customers would like, and typically the aramid sheets are directional. This directionality creates different coefficients of thermal expansion in the machine direction and the cross-machine direction in the finished product, and in tear characteristics relating to saturating the sheet. Also such boards are difficult to handle and require a significant amount of handling experience by customers, and they have an affinity to absorb moisture so that some customers must bake each roll in an oven to drive off humidity before it can be used. Also great care must be exercised during manufacturing to avoid chain wrinkles, lay flat, and other undesirable features which can be introduced during the forming, calendering, and rewinding processes. Also there is a recognized problem with electrically conductive particulate contamination, which reduces the electrical properties of the web produced.

According to the present invention a printed circuit board layer, the printed circuit board per se, and a method of producing printed circuit boards, are provided which are advantageous compared with conventional aramid-based and glass-based printed circuit boards. According to the invention it is preferred to use the foam process, such as described in U.S. Pat. No. 5,904,809 (the disclosure of which is hereby incorporated by reference herein) and the primary fiber used in the construction of PWBs according to the invention is acrylic fiber, more particularly a high tenacity acrylic fiber such as polyacrylonitrile. According to the invention it has been found that acrylic fibers are highly advantageous in the production of PWBs.

According to another aspect of the present invention, the non-woven web or sheet may be made utilizing the foam process. The foam process is highly efficient in handling fibers like acrylic fibers, allowing the formation of a much more uniform web, and allowing fiber blending to a much better extent than webs produced by the water laid process. Fiber blending may be particularly important in the production of printed circuit board layers containing acrylic fibers. Conventional non-conductive fillers (such as plastic or glass particles) can be incorporated in the foam and are uniformly distributed in the final web produced. Also by using the foam process the density of the fiber-containing webs or sheets produced may be much more closely regulated than when the water laid process is utilized, other fibers such as aramid and glass may be readily incorporated, and the entire formation process is less expensive and more energy efficient.

Utilizing the invention, printed circuit boards, and layers for printed circuit boards, may be produced containing at least 50% acrylic fiber, and preferably about 60–80% straight high tenacity acrylic fiber about 3–12 mm long with a diameter of about 6–15 microns, and about 40–20% fibrillated acrylic fibers (i.e. pulp fibers). Substantially 100% acrylic fiber boards and layers may be produced according to the invention, but there typically will be at least some other non-conductive fibers, like glass fibers, or aramid fibers, or non-conductive fillers, and 0–40% non-conductive organic or inorganic binder.

The web or sheet produced according to the invention is typically densified or compressed (as by using conventional thermal calendering rolls) preferably so that it has a density of between about 0.1–1 grams per cubic centimeter, and a basis weight of between 20–120 grams per square meter. The web or sheet may be binder free, or may comprise about 1%–40% (preferably less than 20%) by weight of a substantially electrically non-conductive organic or inorganic binder.

According to another aspect of the present invention a printed circuit board is provided comprising the following components: A plurality of substantially electrically non-conductive substrate layers. At least one of the layers comprising, prior to pre-preg, a non-woven layer comprising at least 50% by weight acrylic fibers. [Preferably a pre-preg material, impregnates at least some of the layers.] And, electrically conductive circuit elements provided on or between at least one of the substrate layers. Most printed circuit boards are made with between three to six layers, although a significant number of boards are also made using seven to eight layers, and there are also many boards made using nine or more layers. The pre-preg material when used is entirely conventional, and typically is epoxy resin, and the electrically conductive circuit elements are also completely conventional (as is their positioning), typically comprising copper strips, wires, or deposits, or like physical structures of other conductive materials such as silver. Typically the at least one layer containing the acrylic fibers is produced by the foam process (although it may be produced by the water laid process), and may have at least about 90% by weight acrylic fibers prior to pre-preg. Each of the substrate layers may have a density of about 0.1–1 grams per cubic centimeter prior to pre-preg, and the board typically further comprises a plurality of electronic components (such as computer chips, diodes, resistors, etc.) connected to the board substrate, and to the electrically conductive circuit elements, using entirely conventional techniques.

According to another aspect of the present invention, a method of producing a printed circuit board is provided comprising the following: (a) Producing a non-woven sheet or web comprising at least 50% by weight (up to substantially 100%) acrylic fibers, and the balance at least one of substantially electrically non-conductive fibers, filler, and binder. (b) Densifying (e.g. thermal calendering) the sheet or web from (a). (c) Forming a printed circuit board layer using the sheet or web from (b). (d) Combining the layer from (c) with other substantially electrically non-conductive layers, and (e) Providing electrically conductive circuit elements on or between at least one of the layers from (c). There may also be, between (c) and (d), (f) forming a pre-preg from the layer of (c) by impregnating the layer with resin or the like. And, (g) curing the pre-preg of (d)–(f) to produce a printed circuit board.

Procedure (b) is conventional, and typically is accomplished utilizing calendering rollers, and a temperature over 200° C. and a pressure of at least 500 psi. The layering of the sheets or webs to produce the printed circuit board, of (c), and the pre-preg formation of (f), and combining a layer from (c) with other substantially electrically non-conductive layers as in (d), and providing the electrically conductive circuit elements as recited in (e), as well as the securing of (g), are also all conventional. Also there preferably are the further conventional procedures of (h) mechanically acting on the board from (g); and (i) electrically and physically connecting electronic components to the board from (h), and to the circuit elements.

In the implementation of the invention (a) is preferably practiced by the foam process. Also, (a) and (b) are typically practiced to produce a sheet or web having a density of about 0.1–1 grams per cubic centimeter, and (a) is typically practiced using about 40–20% fibrillated acrylic fibers (e.g. about 30%), and about 60–80% straight high tenacity acrylic fibers. Either substantially no binder, or about 1–40% by weight organic or inorganic non-conductive binder, may be used.

The substrates according to the invention, and produced according to the method of the invention, are advantageous compared to the prior art. They have or are:

Far superior resin wet out than aramid papers or woven glass.

Improved fiber consolidation creating less fiber fuzz during resin impregnation.

Easier to cut both in the substrate form, and in the impregnated pre-preg or laminate form.

Easier to laser cut and drill holes because glass absorbs laser energy more than the non-wovens of the invention.

Lower moisture pick up than aramid papers.

Improved dimensional stability.

Improved MD/CD ratio and stability.

Lower weight than glass fiber; and

Good adhesion to impregnating resins typically used in laminate production.

It is the primary object of the present invention to produce acrylic fiber-containing layers, and printed circuit boards formed from one or more of such layers, which have enhanced utility and/or enhanced ease and reduced cost of production, compared to conventional glass and aramid fiber-containing layers or boards. This and other objects of the invention will become clear from an inspection of the detailed description of the invention, and from the appended claims.

DETAILED DESCRIPTION OF THE DRAWINGS

Figure 1:
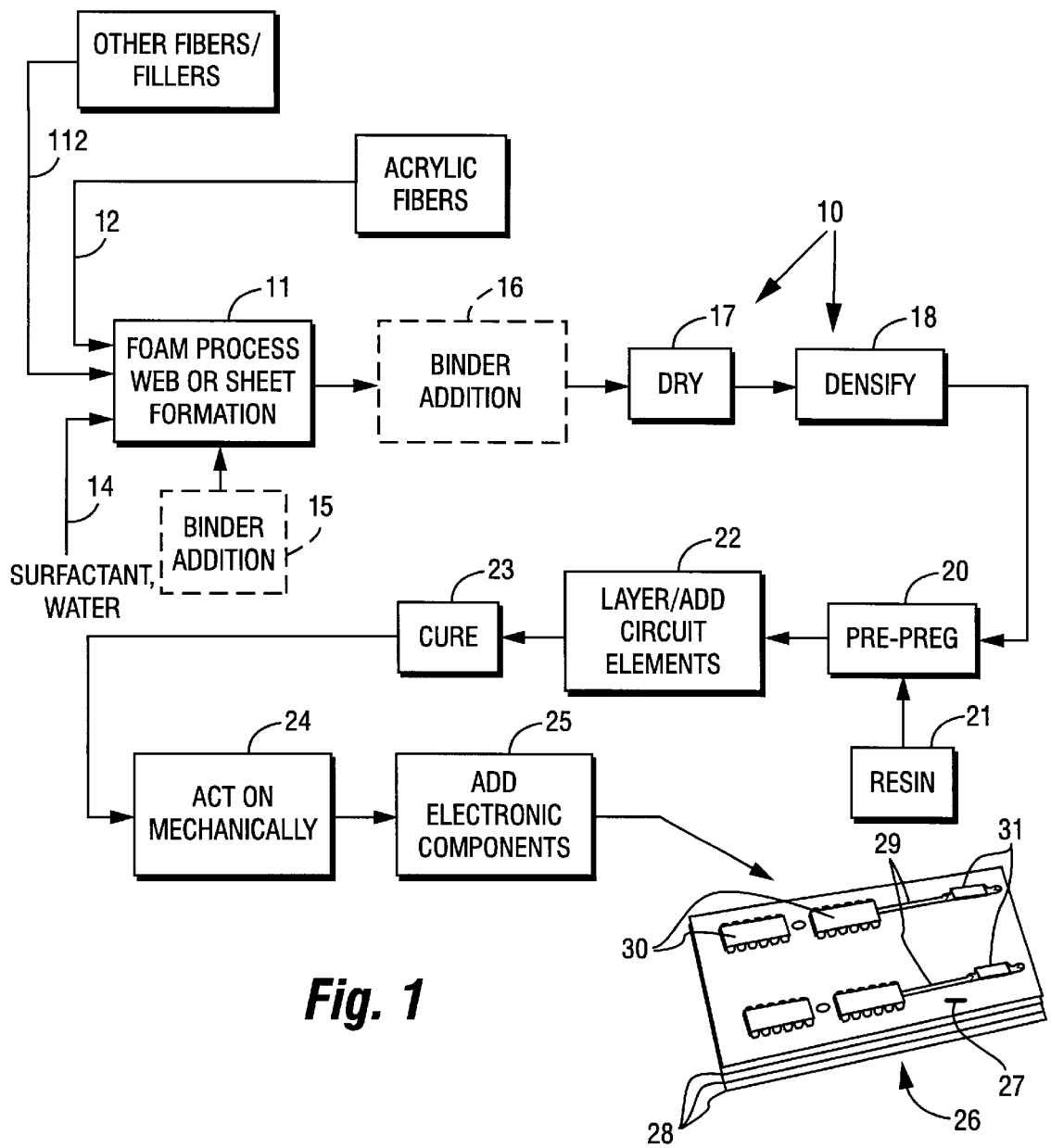
FIG. 1 is a schematic view illustrating an exemplary method according to the present invention, resulting in the production of a printed circuit board.

FIG. 1 schematically illustrates a preferred method 10 of producing printed circuit boards, which have at least one layer containing acrylic fibers. The first procedure according to the invention is the production of a web or a sheet preferably using the foam process, although the wet laid process may be used instead, as illustrated schematically at 11 in FIG. 1. Acrylic fibers from source 12, other fibers or fillers from source 112, surfactant and water from source 14, and the like are provided, and the foam process is practiced preferably as described in U.S. Pat. No. 5,904,809, or the prior art mentioned therein. Typically the slurry has a consistency of at least about 5%, e.g. about 5–50%. Typically some binder will be added to the web, either prior to formation, as indicated schematically at 15 in FIG. 1, and/or after formation, as indicated schematically at 16 in FIG. 1. The binder may comprise about 1%–40% (preferably less than 20%) by weight of a substantially electrically non-conductive organic binder. Examples of known binders for that purpose are: epoxy, acrylic, melamine formaldehyde, polyvinyl alcohol, phenolics, or urethanes, and combinations thereof. Alternatively about 1–40% inorganic binder, such as silica, may be used.

After web or sheet formation, the web or sheet is dried as indicated schematically at 17 in FIG. 1 using conventional drying equipment (such as a drying oven), and the web is densified as indicated schematically at 18, e.g. using conventional calendering rolls in a thermal calendering operation at a temperature greater than 200° C. and a pressure greater than 500 psi. Typically steps 11, 15 and 16, 17 and 18 will take place at one location, and then the final web or sheet produced (if a web is produced it is wound using conventional techniques, and if sheets are produced they are typically stacked for transport) is transported to another location where the other conventional steps for printed circuit board production take place.

The webs or sheets produced by the steps 11 and 15 through 18 typically have a density of between about 0.1–1 grams per cubic centimeter, and a basis weight of between about 20–120 grams per square meter.

The step schematically illustrated at 20 in FIG. 1 is a pre-preg step, where the web or sheets from 18 are impregnated with epoxy resin from source 21 or the like, the impregnating resin being substantially electrically non-conductive. After pre-preg formation, the board is layered— that is various layers are utilized (either the layers from procedure 18, or other layers produced by conventional techniques and of more conventional materials, such as glass or aramid fibers or the like, blends with liquid crystalline polymers (e.g. Vectran), fibrillated acrylic fibers (normally >90% polyacrylonitrile), acrylic pulp, DuPont Fibrids, micro fiberglass (normally <5 micron diameter), polyester fiber, PEN fibers, PPS fibers, MF fibers, and phenolic)—are assembled together and circuit elements added, as schematically illustrated at 22. Circuit elements may be added in any conventional manner (e.g. screen printing, cladding, mechanical laydown and attachment, etc.) Then the layered intermediate board, with circuit elements, is cured in a conventional manner as in a curing oven, as illustrated schematically at 23 in FIG. 1.

After curing at 23, the intermediate board is acted on mechanically—as illustrated schematically at 24 in FIG. 1—as is conventional, e.g. various holes being formed therein, shaping, shaving, texturing, enhancing exposure of circuit elements, or the like. Then the electronic components are added—as schematically illustrated at 25 in FIG. 1—to produce the final circuit board illustrated schematically at 26 in FIG. 1. The electronic component addition step 25 is also conventional, various electronic elements that are to be utilized on the final board 26 being mechanically connected to the board and electrically connected to each other and/or circuit elements.

The board 26, being only very schematically illustrated in FIG. 1, comprises the substrate 27 formed of multiple (typically between three and nine, but most typically between three and six) layers, illustrated schematically at 28 in FIG. 1. According to the invention each of the layers 28 may comprise at least 50% by weight (prior to pre-preg) acrylic fibers (preferably a mixture of straight and pulp) fibers. However the layers 28 may have different percentages and types of acrylic fibers therein, or some of the layers 28 may be conventional glass or aramid layers, or have other conventional constructions. However about 90% (by weight) or more acrylic pulp fibers may be used.

The final circuit board 26 illustrated in FIG. 1 also has electrically conductive circuit elements 29, which are strips, wires, or deposits of electrically conductive material, such as copper, silver, or other conventional conductive materials or blends thereof. The elements 29 connect electronic components together, and connect the board 26 to a power source, other boards, or other external components. FIG. 1 schematically illustrates conventional chips 30 as electronic components, as well as diodes or resistors or capacitors 31, or the like. Any conventional electronic components can be utilized in the construction of the board 26 according to the invention.

The board 26 according to the invention will have better dimensional stability in moisture than conventional aramid and glass boards, therefore can have higher circuit density and is less susceptible to high frequency energy corruption. Also because of a better co-efficient of thermal expansion, the board 26 can be expected to have longer life than an otherwise conventional board, and is otherwise advantageous as described above.

Figure 3:
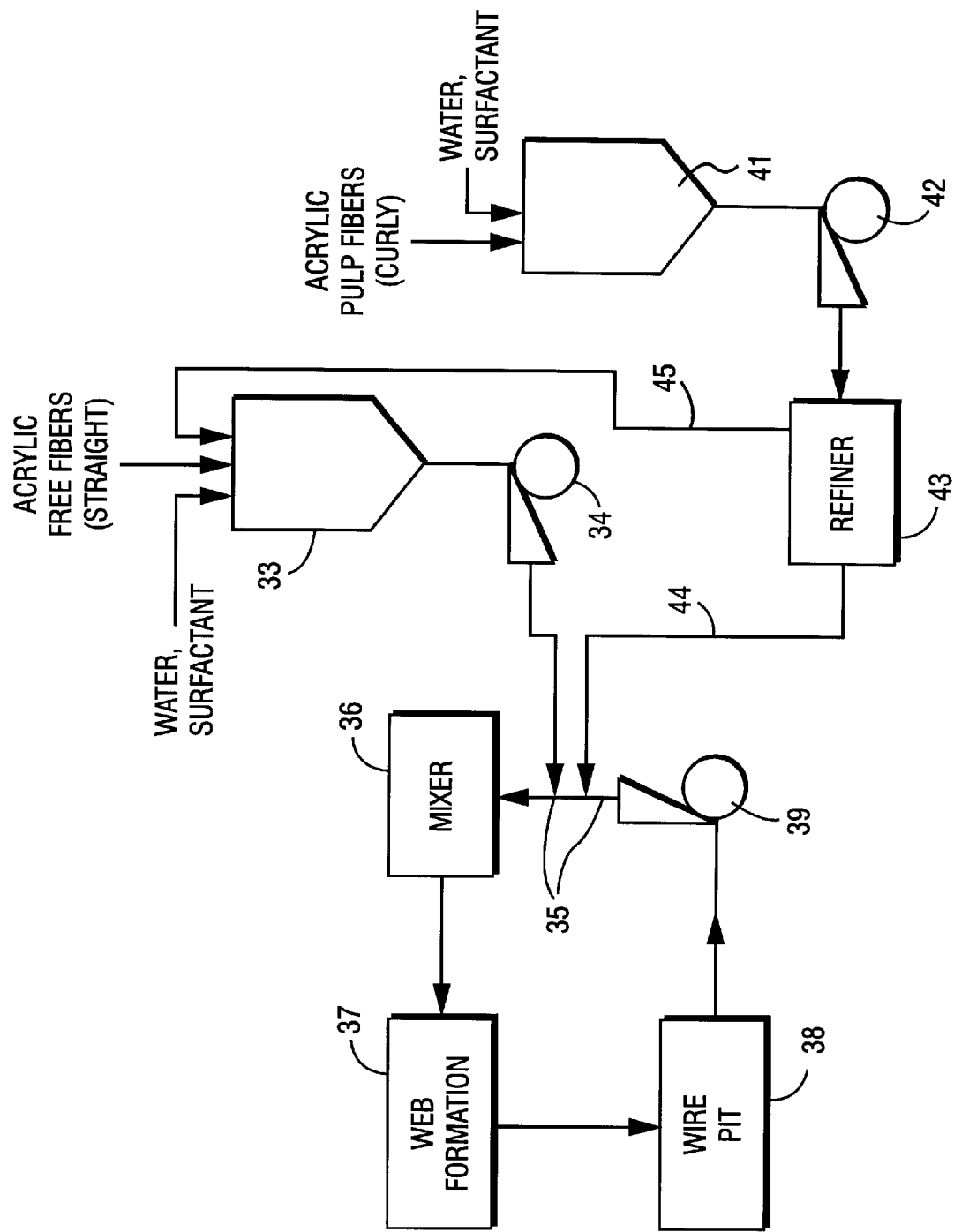
FIG. 3 is a schematic representation of the practice of the foam process utilizing the invention.

In the web formation step 11, the appropriate type and percentage of fibers will be added to get the desired results, as described more fully with respect to FIG. 3. The fibers added at 12 are at least 50% by weight acrylic fibers. Conventional straight and fibrillated (pulp) high tenacity acrylic fibers may be added—conventional fillers may also be utilized, as long as they are substantially electrically non-conductive, such as known glass and plastic particulate fillers—and other fibers may be added.

Figure 2:
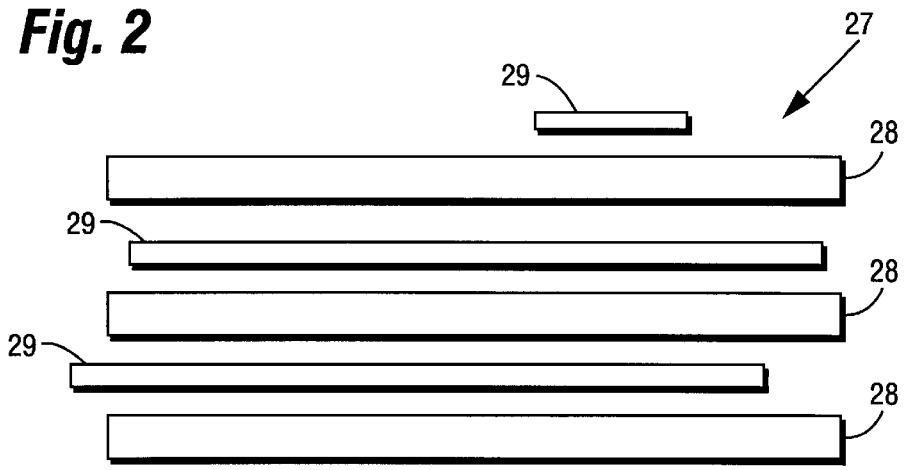
FIG. 2 is an exploded schematic view of a circuit board according to the present invention without electronic components mounted thereon.

FIG. 2 schematically illustrates the board 26 before the mechanical activity at 24 and the electrical component addition at 25 from FIG. 1, showing the components in an exploded view. Each of the layers 28 are preferably produced by the steps 11 and 15 through 18 (as well as by pre-preg at 20) and can have varying fiber compositions, but preferably each have at least 50% acrylic fibers. The electrically conductive circuit elements are shown disposed between the layers 28, and may overlap the edges of the layers 28 for connection to external components, or to facilitate connection to components that will ultimately be mounted on the substrate 27. As is conventional, one or more of the layers 28 may be etched, mechanically sanded or handled, or otherwise acted upon to expose circuit elements 29 where necessary or desirable.

FIG. 3 schematically shows a procedure for producing non-woven webs according to the invention. Acrylic fibers are added to a pulper 33 along with surfactant and water, and possibly other types of fibers, binder, or fillers. The acrylic fibers added to pulper 33 are preferably high tenacity straight acrylic fibers such as polyacrylonitrile fiber preferably from 3–12 mm in length and 6–15 microns in diameter.

The foam slurry discharged from 33 is pumped by pump 34 to a line 35 leading to conventional mixer 36. From mixer 36 the slurry proceeds to conventional web formation at 37. As is conventional, foam and liquid removed from 37 goes to wire pit 38 and is recirculated by pump 39 to the mixer 36, the recirculated slurry from wire pit 38 being mixed with the fiber slurry from pulper 33 in mixer 36.

Preferably the straight acrylic fibers from 33 are also mixed with acrylic pulp (fibrillated) fibers too. This may be accomplished in several ways, such as the two alternative (or complementary) ways shown in FIG. 3.

Acrylic pulp fibers are added to pulper 41 with water, and preferably water and surfactant, and then the slurry so formed is pumped by pump 42 to be refined in a conventional refiner or deflaker 43, or another device capable of applying high shear to the acrylic pulp in the slurry.

From the high shear device 43 the slurry of fibrillated acrylic fibers may be added directly to line 35 prior to mixer 36, so that the straight and fibrillated acrylic fibers are uniformly dispersed prior to web formation. In addition, or alternatively, some of the fibrillated acrylic fiber slurry may be fed from high shear device 43 to the pulp 33.

In the preferred embodiment at least some fibrillated acrylic fibers are added to the straight acrylic fibers to comprise the at least 50% acrylic fiber product produced. The desired mix of acrylic fibers is about 20–80% (preferably about 70%) straight fibers, and about 40–20% (preferably about 30%) fibrillated fibers.

As one example 30% refined fibrillated acrylic fibers and 70% straight acrylic fibers, which collectively make up about 85% by weight of the final non-woven sheet or web to be produced are mixed with about 10% by weight glass or polyester or aramid fibers and about 5% by weight organic binder [all prior to pre-preg percentages]. The non-woven web or sheet produced is made by the wet laid or foam process, preferably the foam process.

In the description provided above all ranges include all narrower ranges within a broad range. For example, about 1–40% by weight binder means 2–5%, 3–20%, 25–15%, and all other narrower ranges within the broad range.

It will thus be seen that according to the present invention a highly advantageous non-woven sheet or web for use in a printed circuit board construction, a printed circuit board, and a method of producing a printed circuit board, have been provided. While the invention has been herein shown and described in what is presently conceived to be the most practical and preferred embodiment thereof, it will be apparent to those of ordinary skill in the art that many modifications may be made thereof within the scope of the invention, which scope is to be accorded the broadest interpretation of the appended claims so as to encompass all equivalent structures and methods.

What is claimed is:

1. A method of producing a printed circuit board comprising:
   (a) using a foam-laid process for making non-woven fibrous webs to form a non-woven sheet or web comprising at least 50% by weight of a mixture of both fibrillated and straight acrylic fibers, and the balance at least one of substantially electrically non-conductive fibers, filler, and binder;
   (b) densifying the sheet or web from (a);

(c) forming a printed circuit board layer using the sheet or web from (b);

(d) combining the layer from (c) with other substantially electrically non-conductive layers; and (e) providing electrically conductive circuit elements on or between at least one of the layers from (c).

2. A method as recited in claim 1 wherein (a) is practiced using a mixture of about 50–80% straight fibers, and about 40–20% fibrillated fibers that may have been refined.

3. A method as recited in claim 2 wherein (a) and (b) are practiced to produce a sheet or web having a density of 0.1–1 g/cm$^3$, and wherein (a) is practiced by the foam process using a slurry having a solids consistency of at least about 5%.

4. A method as recited in claim 2 wherein (a) is practiced using polyacrylonitrile fibers from about 3–12 mm long and from about 6–15 microns in diameter.

5. A method as recited in claim 2 further comprising (f), between (c) and (d), forming a pre-preg from the layer of (c) by impregnating the layer with resin; and (g), after (e), of curing the pre-preg to produce a printed circuit board.

6. A method as recited in claim 1 wherein (b) is practiced by thermal calendering at a temperature of greater than 200° C. and a pressure of greater than 500 psi.

7. A method as recited in claim 1 further comprising (f), between (c) and (d), forming a pre-preg from the layer of (c) by impregnating the layer with resin; and (g), after (e), of curing the pre-preg to produce a printed circuit board.

8. A method as recited in claim 1 wherein (a) is practiced using polyacrylonitrile fibers from about 3–12 mm long and from about 6–15 microns in diameter.

9. A method as recited in claim 8 wherein (a) is practiced substantially without binder.

10. A method as recited in claim 8 wherein (a) is practiced using 1–40% by weight organic or inorganic binder.

11. A method as recited in claim 10 wherein (a) is practiced by using a mixture of both fibrillated and straight acrylic fibers.

12. A method as recited in claim 1 wherein (a) and (b) are practiced to produce a sheet or web having a density of 0.1–1 g/cm$^3$, and wherein (a) is practiced by the foam process using a slurry having a solids consistency of at least about 5%.

13. A method as recited in claim 1 wherein (a) and (b) are practiced to produce a sheet or web having a density of 0.1–1 g/cm$^3$.

14. A method as recited in claim 1 wherein (a) is practiced using at least 90% acrylic fibers.

15. A method of producing a printed circuit board comprising:

(a) producing a non-woven sheet or web comprising at least 60% by weight of a mixture of both fibrillated and straight acrylic fibers and the balance at least one of substantially electrically non-conductive fibers, filler, and binder;

(b) densifying the sheet or web from (a);

(c) forming a printed circuit board layer using the sheet or web from (b);

(d) combining the layer from (c) with other substantially electrically non-conductive layers; and (e) providing electrically conductive circuit elements on or between at least one of the layers from (c).

16. A method as recited in claim 15, wherein (a) is practiced using a foam-laid process for making non-woven fibrous webs.

17. A method as recited in claim 15 wherein the mixture includes about 60–80% straight fibers, and about 40–20% fibrillated fibers that may have been refined.

18. A method as recited in claim 15 wherein (a) is practiced using polyacrylonitrile fibers from about 3–12 mm long and from about 6–15 microns in diameter.

19. A method as recited in claim 18 wherein (a) is practiced substantially without binder.

20. A method as recited in claim 19 wherein (a) is practiced using at least 90% acrylic fibers.

21. A method as recited in claim 18, wherein (a) is practiced using a foam-laid process for making non-woven fibrous webs.

22. A method as recited in claim 21 wherein (a) is practiced using polyacrylonitrile fibers from about 3–12 mm long and from about 6–15 microns in diameter.

23. A method as recited in claim 15 wherein (a) is practiced using at least 90% acrylic fibers.

24. A method of producing a printed circuit board comprising:

(a) producing a non-woven sheet or web comprising at least 50% by weight acrylic fibers comprising a mixture of about 60–80% straight fibers, and about 40–20% fibrillated fibers that may have been refined, and the balance at least one of substantially electrically non-conductive fibers, filler, and binder;

(b) densifying the sheet or web from (a);

(c) forming a printed circuit board layer using the sheet or web from (b);

(d) combining the layer from (c) with other substantially electrically non-conductive layers; and (e) providing electrically conductive circuit elements on or between at least one of the layers from (c).

* * * * *